United States Patent
Lin

(10) Patent No.: US 9,214,571 B2
(45) Date of Patent: Dec. 15, 2015

(54) SEMICONDUCTOR DEVICE CAPABLE OF REDUCING INFLUENCES OF ADJACENT WORD LINES OR ADJACENT TRANSISTORS AND FABRICATING METHOD THEREOF

(71) Applicant: NANYA TECHNOLOGY CORP., Taoyuan (TW)

(72) Inventor: Shian-Jyh Lin, New Taipei (TW)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 0 days.

(21) Appl. No.: 14/641,439

(22) Filed: Mar. 9, 2015

(65) Prior Publication Data
US 2015/0179822 A1    Jun. 25, 2015

Related U.S. Application Data

(62) Division of application No. 13/325,063, filed on Dec. 14, 2011, now Pat. No. 9,024,377.

(51) Int. Cl.
*H01L 29/792* (2006.01)
*H01L 27/108* (2006.01)

(52) U.S. Cl.
CPC ............ *H01L 29/792* (2013.01); *H01L 27/108* (2013.01); *H01L 27/10823* (2013.01); *H01L 27/10876* (2013.01); *H01L 27/10891* (2013.01)

(58) Field of Classification Search
CPC ................... H01L 27/10876; H01L 27/10891; H01L 29/792

USPC .................. 257/324, 315, 317, 330; 438/259, 438/270–271, 589
See application file for complete search history.

(56) References Cited

U.S. PATENT DOCUMENTS

| | | | |
|---|---|---|---|
| 6,794,279 B1* | 9/2004 | Stephen et al. | 438/585 |
| 7,227,219 B2 | 6/2007 | Mikolajick | |
| 2002/0185674 A1* | 12/2002 | Kawashima et al. | 257/315 |
| 2005/0189582 A1 | 9/2005 | Mikolajick | |
| 2006/0108646 A1 | 5/2006 | Hofmann | |
| 2009/0127611 A1* | 5/2009 | Park et al. | 257/316 |
| 2009/0231921 A1* | 9/2009 | Kimura et al. | 365/185.18 |

FOREIGN PATENT DOCUMENTS

| | | |
|---|---|---|
| CN | 1551362 A | 12/2004 |
| CN | 1799139 A | 7/2006 |
| TW | 200502986 | 1/2005 |

* cited by examiner

*Primary Examiner* — Kyoung Lee
*Assistant Examiner* — Ratisha Mehta
(74) *Attorney, Agent, or Firm* — Winston Hsu; Scott Margo

(57) ABSTRACT

A semiconductor device capable of reducing influences of adjacent word lines is provided in the present invention. The semiconductor device includes: a substrate, and a word line disposed in the substrate. The word line includes: a gate electrode, a gate dielectric layer disposed between the gate electrode and the substrate and at least one first charge trapping dielectric layer disposed adjacent to the gate electrode, wherein the first charge trapping dielectric layer comprises $HfO_2$, $TiO_2$, $ZrO_2$, a germanium nanocrystal layer, an organic charge trapping material, $HfSiO_xN_y$, or $MoSiO_qN_z$.

11 Claims, 11 Drawing Sheets

(a)

(b)

SEMICONDUCTOR DEVICE CAPABLE OF REDUCING INFLUENCES OF ADJACENT WORD LINES OR ADJACENT TRANSISTORS AND FABRICATING METHOD THEREOF

CROSS REFERENCE TO RELATED APPLICATIONS

This is a division of U.S. application Ser. No. 13/325,063 filed Dec. 14, 2011, which is included in its entirety herein by reference.

BACKGROUND OF THE INVENTION

1. Field of the Invention

The invention relates generally to a semiconductor device, and particularly to a semiconductor device capable of reducing influences of adjacent elements.

2. Description of the Prior Art

An access transistor, such as a field effect transistor is used in a memory structure such as a dynamic random access memory (DRAM) cell. The access transistor is for controlling a capacitor used to store charge representing information contained in a DRAM cell.

In a DRAM array, a word line is coupled to many transistor gates, and a bit line or a digit line is coupled to many transistor drains. During the operation of the DRAM array, an access transistor that is located at the intersection of the selected word line and the selected digit line is turned ON, and the DRAM cell within the DRAM array is accessed.

The DRAM cell is being continually reduced in size to decrease manufacturing costs and to increase speed. However, as the devices are scaled down, word lines in the DRAM array are getting closer to each other. In this manner, when one transistor gate is turned ON, functions of the adjacent transistor gate may be influenced.

SUMMARY OF THE INVENTION

The present invention provides a semiconductor device which can reduce influences of adjacent word lines or adjacent transistors to solve the above-mentioned problems.

According to one aspect of the present invention, a semiconductor device capable of reducing influences of adjacent word lines is provided. The semiconductor device includes: a substrate, and a first word line disposed in the substrate and two source/drain doping regions disposed in the substrate at two side of the first word line. The first word line includes: a first gate trench disposed in the substrate, a first gate electrode disposed at in the first gate trench, a first gate dielectric layer disposed between the first gate electrode and the substrate and at least one first charge trapping dielectric layer disposed adjacent to the gate electrode, wherein the first charge trapping dielectric layer comprises $HfO_2$, $TiO_2$ or $ZrO_2$, a germanium nanocrystal layer, an organic charge trapping material, $HfSiO_xN_y$, or $MoSiO_qN_z$, wherein x, y, q and z are integers.

According to another aspect of the present invention, a semiconductor device capable of reducing influences of adjacent transistors comprising: a substrate, a first transistor disposed on the substrate, wherein the first transistor comprising: a first gate electrode disposed on the substrate, a first gate dielectric layer disposed between the first gate electrode and the substrate and at least one first charge trapping dielectric layer disposed adjacent to the first gate electrode, wherein the first charge trapping dielectric layer comprises $HfO_2$, $TiO_2$, $ZrO_2$, a germanium nanocrystal layer, an organic charge trapping material, $HfSiO_xN_y$, or $MoSiO_qN_z$, wherein x, y, q and z are integers.

According to another aspect of the present invention, a semiconductor device capable of reducing influences of adjacent elements includes: a substrate, a shallow trench embedded in the substrate and a charge trapping dielectric layer filling in the shallow trench, wherein the charge trapping dielectric layer comprises $HfO_2$, $TiO_2$ or $ZrO_2$, a germanium nanocrystal layer, an organic charge trapping material, $HfSiO_xN_y$, or $MoSiO_qN_z$, wherein x, y, q and z are integers.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
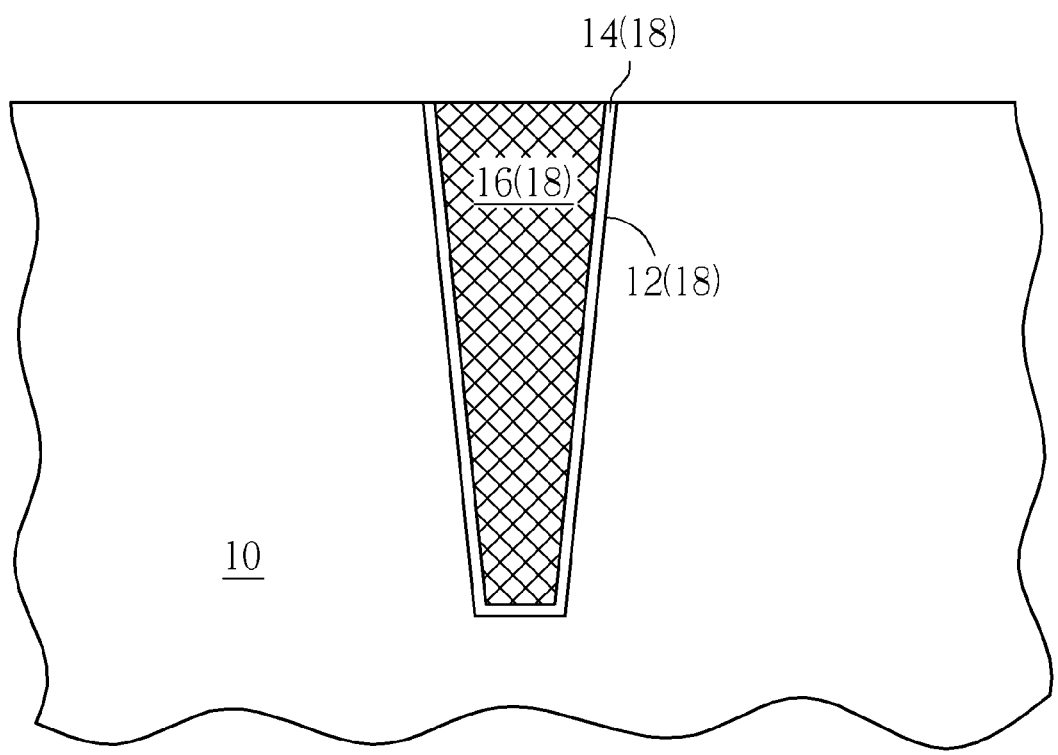
FIG. 1 to FIG. 4 depict schematically a fabricating method of a semiconductor device capable of reducing influences of adjacent word lines according to a first embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, in which multiple embodiments are disclosed and described having some features in common, for clarity and ease of illustration and description thereof, like or similar features will ordinarily be described with like reference numerals.

FIG. 1 to FIG. 4 depict schematically a fabricating method of a semiconductor device capable of reducing influences of adjacent word lines according to a first embodiment of the present invention.

As shown in FIG. 1, firstly, a substrate 10 is provided. Then, a shallow trench 12 is formed within the substrate 10. After that, a linear layer 14 is formed on an inner sidewall of the shallow trench 12. Later, an isolation material layer 16 is formed to fill up the shallow trench 12. At this point, a shallow trench isolation (STI) 18 is completed. The isolation layer 16 can be a single material layer or a composite material layer. The composite material layer consists of numerous different material layers. Furthermore, if the aforementioned isolation layer 16 is a single material layer, the isolation layer 16 may be formed by a charge trapping dielectric such as $HfO_2$, $TiO_2$, $ZrO_2$, a germanium nanocrystal layer, an organic charge trapping material, $HfSiO_xN_y$, $MoSiO_qN_z$, or a combination thereof, wherein x, y, q and z are integers. The organic charge trapping material may be Poly(alpha methylstyrene).

Furthermore, if the isolation layer 16 is a composite material layer, the isolation layer 16 may be formed by the combination of at least one charge trapping dielectric and at least one traditional dielectric. The traditional dielectric can be $SiO_2$ or $Si_3N_4$.

According to another preferred embodiment, the isolation material layer 16 could also only be made of a conventional dielectric layer such as $SiO_2$.

Figure 2:
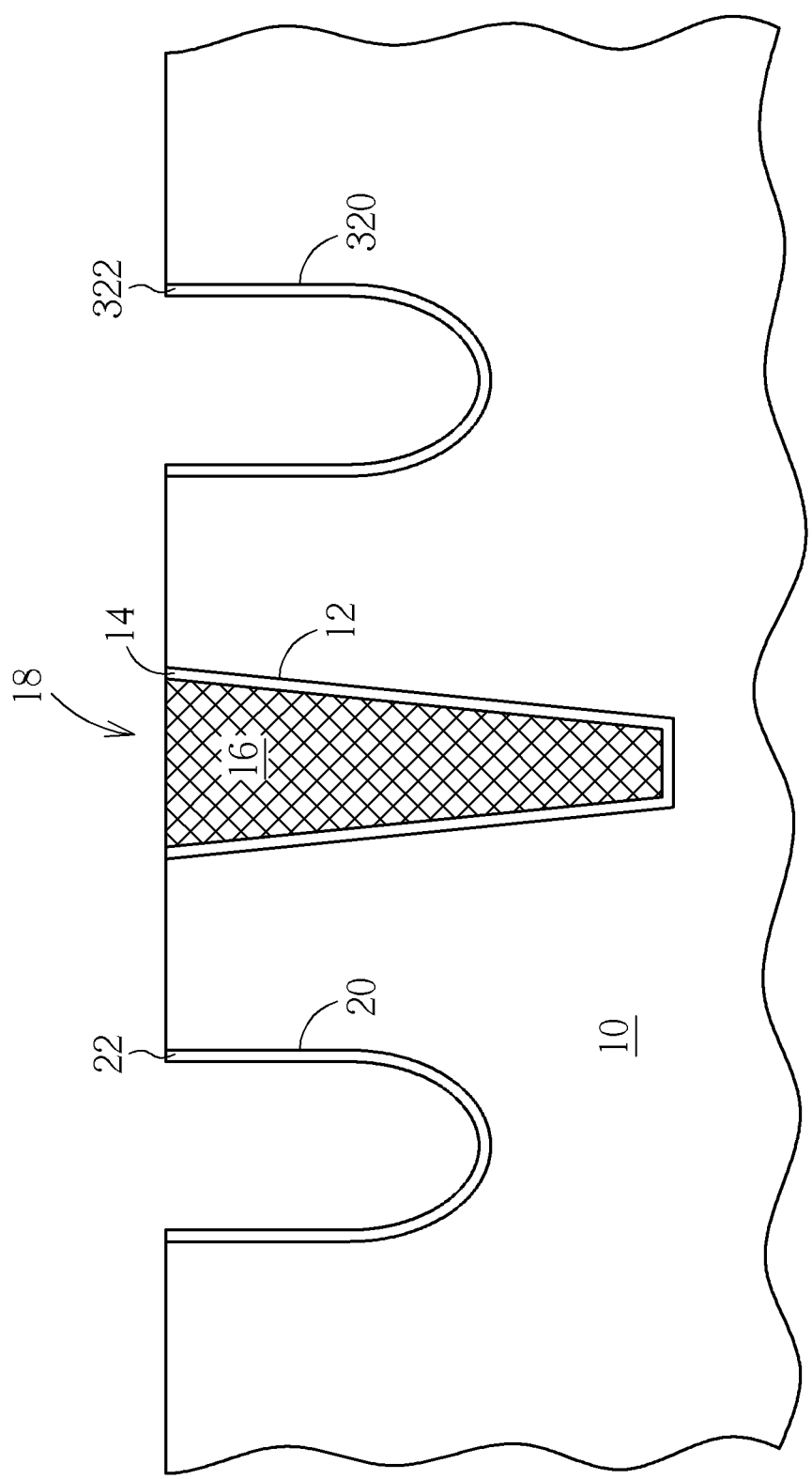
Figure 3:
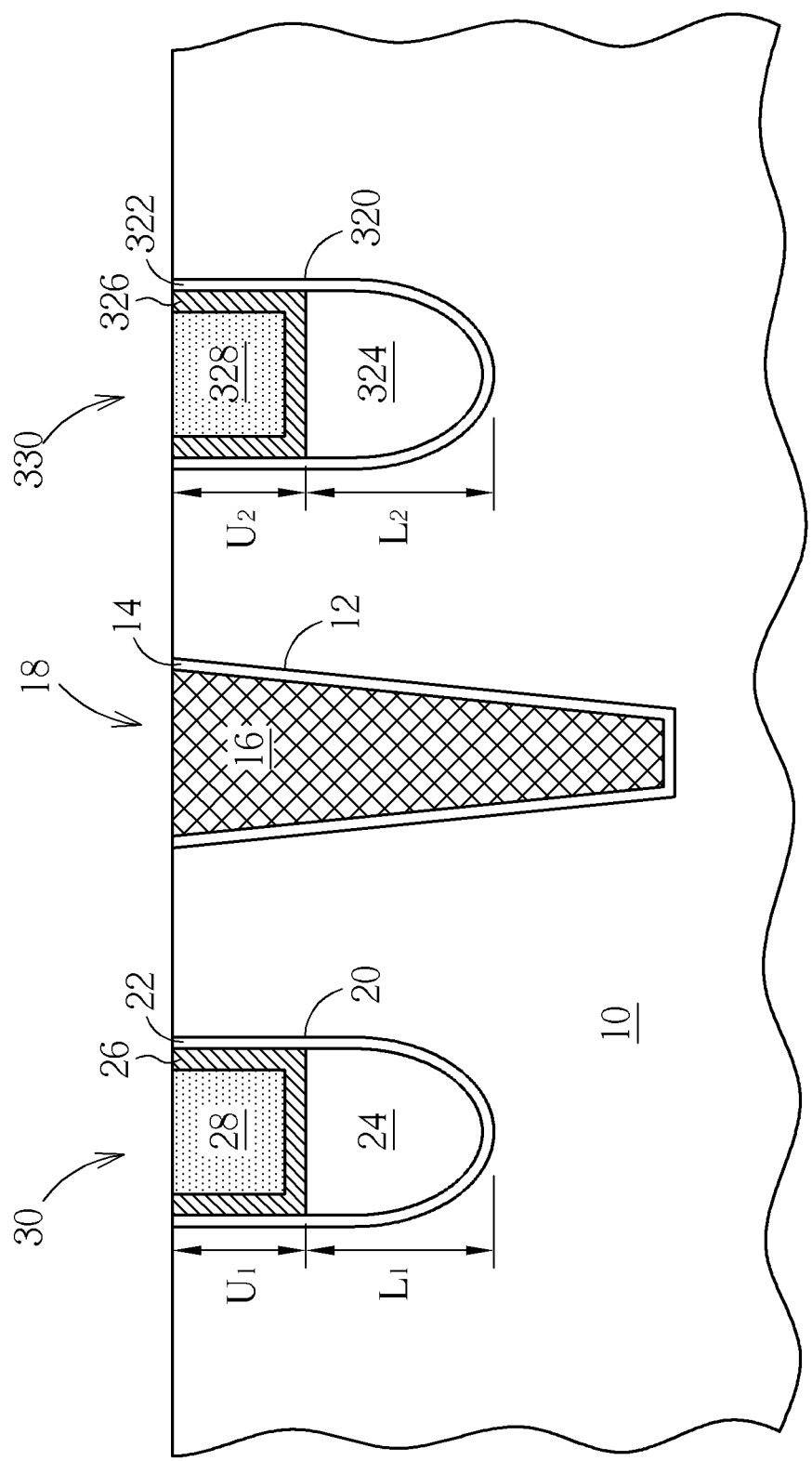
Figure 4:
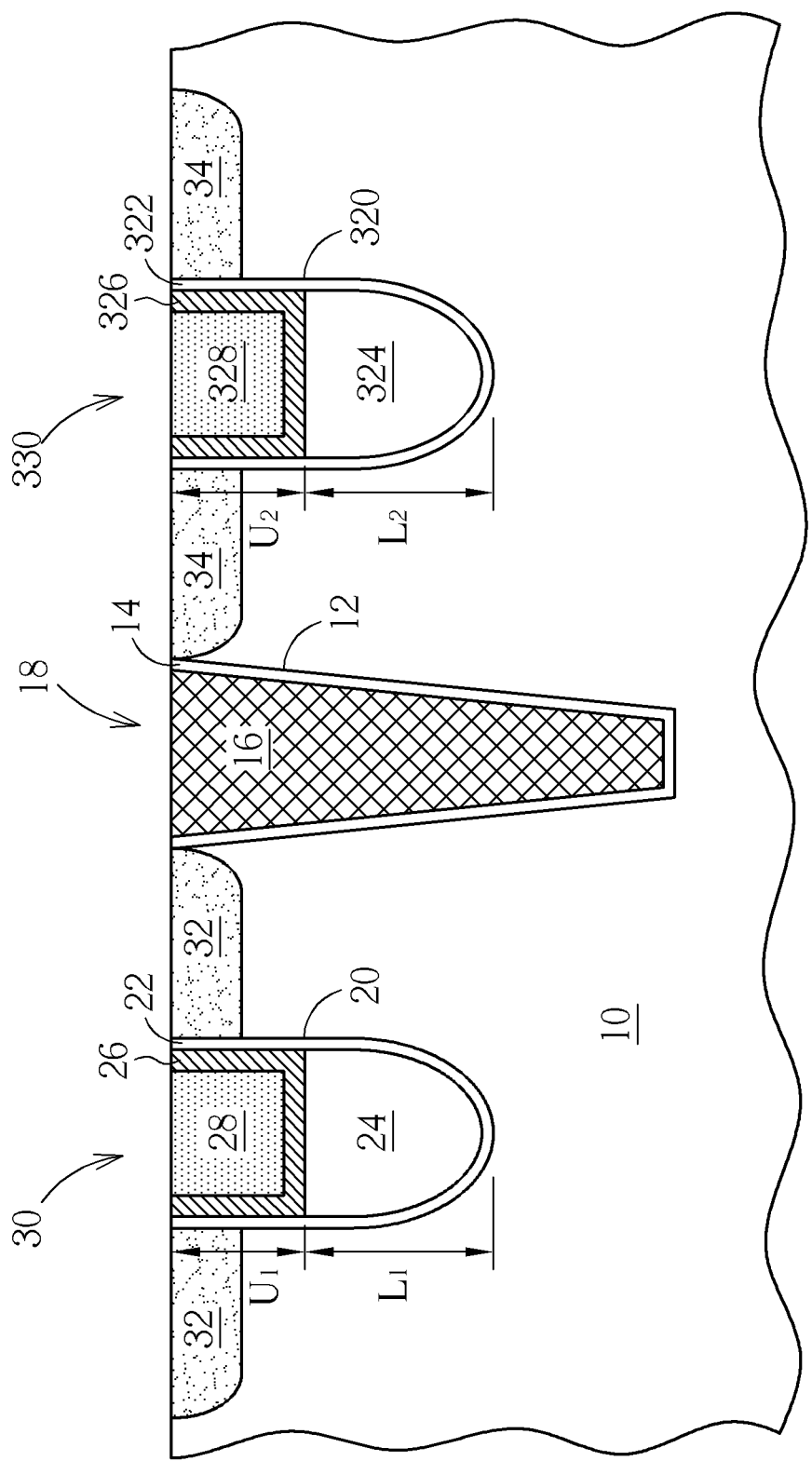

FIG. 2 to FIG. 4 combine with the following description will describe a method of fabricating two adjacent word lines. The two adjacent word lines are preferably apply in the DRAM field. As shown in FIG. 2, two gate trenches 20, 320 are formed in the substrate 10 at two sides of the STI 18. The gate trenches 20, 320 both preferably adjacent to the STI 18. Two gate dielectric layers 22, 322 are subsequently formed on an inner sidewall of the gate trenches 20, 320 respectively at the same fabricating step. The gate dielectric layers 22, 322 may be $SiO_2$. As shown in FIG. 3, two gate electrodes 24, 324 are formed at a lower part $L_1$ of the gate trench 20 and a lower part $L_2$ of the gate trench 320 respectively. After that, two charge trapping dielectric layers 26, 326 are formed respectively at an upper part $U_1$ of the gate trench 20 and at an upper part $U_2$ of the gate trench 320. More specifically, the charge trapping dielectric layer 26 is formed conformally along the gate dielectric layer 22 and on a top of the gate electrode 24; the charge trapping dielectric layer 326 is formed conformally along the gate dielectric layer 322 and on a top of the gate electrode 324. The charge trapping dielectric layers 26, 326 can optionally contact the gate electrodes 24, 324 respectively. Advantageously, the charge trapping dielectric layer 26 contacts the gate electrode 24, and the charge trapping dielectric layer 326 contacts the gate electrode 324, but not limited to it. The charge trapping dielectric layers 26, 326 both can be a single material layer or a composite material layer.

If the charge trapping dielectric layer 26 is a single material layer, the charge trapping dielectric layer 26 may formed by a charge trapping dielectric such as $HfO_2$, $TiO_2$, $ZrO_2$, a germanium nanocrystal layer, an organic charge trapping material, $HfSiO_xN_y$, $MoSiO_qN_z$, or a combination thereof, wherein x, y, q and z are integers. The organic charge trapping material may be Poly(alpha methylstyrene).

Furthermore, the charge trapping dielectric 26 may also be formed by the combination of at least one charge trapping dielectric with at least one traditional dielectric. The traditional dielectric can be SiO2, Si3N4 or other dielectrics.

Similarly, when the charge trapping dielectric layer 326 is a single material layer, the material for making the charge trapping dielectric layer 326 can be selected from the materials used to make charge trapping dielectric layer 26 mentioned above.

If the charge trapping dielectric layer 26 is a composite material layer, at least one layer of the composite material layer may be formed by the aforementioned charge trapping dielectric and at least one of the composite material layer may be formed by a traditional $SiO_2$ film or a traditional $Si_3N_4$ film. Similarly, when the charge trapping dielectric layer 326 is a composite material layer, the material for making the charge trapping dielectric layer 326 can be selected from the materials used to make the charge trapping dielectric layer 26 with a composite material layer mentioned above. However, the charge trapping dielectric layers 26, 326 do not necessarily to fabricate by the same material. They can have independent structure, for example, the charge trapping dielectric layer 26 can have a single material layer, and the charge trapping dielectric layer 326 can have a composite material layer. However, in FIG. 3, the charge trapping dielectric layers 26, 326 are shown in the same structure.

Later, capping layers 28, 328 are formed to fill in the upper part $U_1$ of the gate trench 20 and the upper part $U_2$ of the gate trench 320, respectively. The capping layers 28 may be $SiO_2$, $Si_3N_4$ or any combination of the charge trapping dielectrics described above. Now, two adjacent word lines 30, 330 of the present invention are completed. It is noteworthy that even there is the STI 18 disposed in the middle of the word lines 30, 330, the word lines 30, 330 are still defined as two adjacent word lines.

As shown in FIG. 4, two source/drain doping regions 32, 34 are formed in the substrate 10 at two sides of the word lines 30, 330. At this point, a semiconductor device capable of reducing influences of adjacent word lines 36 is completed.

FIG. 4 depicts schematically a semiconductor device capable of reducing influences of adjacent word lines according to a second preferred embodiment of the present invention. As shown in FIG. 4, a semiconductor device capable of reducing influences of adjacent word lines 36 includes a substrate 10, two word lines 30, 330, and two source/drain doping regions 32, 34. The word lines 30, 330 are both embedded in the substrate 10, and the word lines 30, 330 are both buried structures disposed in the substrate 10. The two source/drain doping regions 32, 34 are disposed at two sides of the word lines 30, 330, respectively.

The word line 30 includes a gate trench 20 embedded in the substrate 10, a gate electrode 24 disposed at a lower part $L_1$ of the gate trench 20, a gate dielectric layer 22 disposed at an inner sidewall of the gate trench 20 and the gate dielectric layer 22 is sandwiched between the gate electrode 24 and the substrate 10, a charge trapping dielectric layer 26 disposed adjacent to the gate electrode 24. More specifically, the charge trapping dielectric layer 26 is disposed within an upper part $U_1$ of the gate trench 20, and the charge trapping dielectric layer 26 optionally contacts the gate electrode 24, but not limited to it. Based on different requirements, the charge trapping dielectric layer 26 may not contact the gate electrode 24. Preferably, the charge trapping dielectric layer 26 is disposed conformably along the gate dielectric layer 22 and charge trapping dielectric layer 26 is also positioned on or above a top surface of the gate electrode 24.

The word line 330 preferably has the same structure as the word line 30. The word line 330 includes a gate trench 320 embedded in the substrate 10, a gate electrode 324 disposed at a lower part $L_2$ of the gate trench 320, a gate dielectric layer 322 disposed at an inner sidewall of the gate trench 320 and the gate dielectric layer 322 is sandwiched between the gate electrode 324 and the substrate 10, a charge trapping dielectric layer 326 disposed adjacent to the gate electrode 324. More specifically, the charge trapping dielectric layer 326 is disposed within an upper part $U_2$ of the gate trench 320, and the charge trapping dielectric layer 326 optionally contacts the gate electrode 324, but not limited to it. Preferably, the charge trapping dielectric layer 326 is disposed conformably along the gate dielectric layer 322 and charge trapping dielectric layer 326 is also positioned on or above a top surface of the gate electrode 324.

The charge trapping dielectric layers 26, 326 can independently be a single material layer or a composite material layer. The composite material layer consists of numerous different material layers. If the charge trapping dielectric layer 26 or the charge trapping dielectric layer 326 is a single material layer, the charge trapping dielectric layer 26 or the charge trapping dielectric layer 326 may be formed by a charge trapping dielectric such as $HfO_2$, $TiO_2$, $ZrO_2$, a germanium nanocrystal layer, an organic charge trapping material, $HfSiO_xN_y$, $MoSiO_qN_z$, or a combination thereof, wherein x, y, q and z are integers. The organic charge trapping material may be Poly(alpha methylstyrene).

If the charge trapping dielectric layer 26 or the charge trapping dielectric 326 is a composite material layer, the charge trapping dielectric layer 26 or the charge trapping dielectric 326 can be formed by the combination of the aforementioned charge trapping dielectric, and a $SiO_2$ film, a $Si_3N_4$ film or other traditional dielectrics. For example, the charge trapping dielectric layer 26 may consist of two charge trapping dielectrics such as $TiO_2$ and $ZrO_2$ and one $SiO_2$ film, and the trapping dielectric layer 326 may only consist of $HfO_2$.

Two capping layers 28, 328 are disposed in the upper part $U_1$ of the gate trench 20, and the upper part $U_2$ of the gate trench 320. The capping layers 28, 328 may be made of $SiO_2$, $Si_3N_4$ or any combination of charge trapping dielectric described above.

The semiconductor device capable of reducing influences of adjacent word lines 36 can further includes a STI 18 embedded in the substrate 10 between the word lines 30, 330.

Please refer to FIG. 4, the STI 18 includes a shallow trench 12 in the substrate 10, and an isolation material layer 16 fills in the shallow trench 12. The isolation material layer 16 can be $SiO_2$ or a charge trapping dielectric layer. The isolation material layer 16 can be a single material layer or a composite material layer.

If the isolation material layer 16 is a single material layer, the charge trapping dielectric layer may formed by a charge trapping dielectric such as $HfO_2$, $TiO_2$, $ZrO_2$, a germanium nanocrystal layer, an organic charge trapping material, $HfSiO_xN_y$, $MoSiO_qN_z$, or a combination thereof, wherein x, y, q and z are integers. The organic charge trapping material may be Poly(alpha methylstyrene).

Furthermore, if the isolation layer 16 is a composite material layer, the isolation layer 16 may also be formed by the combination of at least one charge trapping dielectric with at least one traditional dielectric. The traditional dielectric can be $SiO_2$, $Si_3N_4$ or other dielectrics.

Furthermore, the semiconductor device capable of reducing influences of adjacent word lines 36 can further include two source/drain doping regions 32, 34 formed in the substrate 10 at two sides of the word lines 30, 330 respectively.

Figure 5:
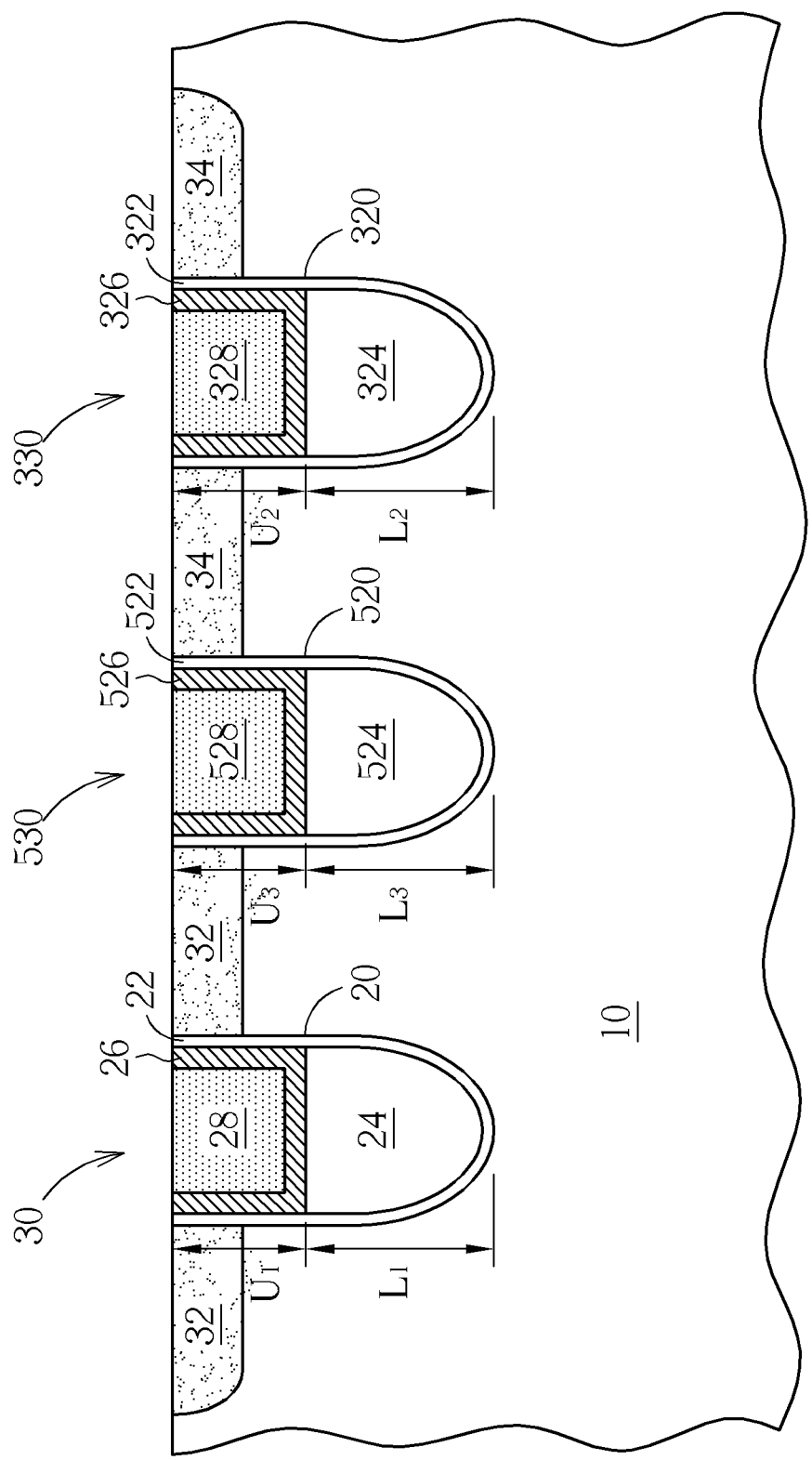
FIG. 5 shows a varied type of a semiconductor device capable of reducing influences of adjacent word lines.

Additionally, as shown in FIG. 5, the STI 18 can be replaced by an isolation gate 530 which may be constructed by the same structure as that of the word line 30. Specifically, the isolation gate 530 includes a gate trench 520 embedded in the substrate 10, a gate electrode 524 disposed at a lower part $L_3$ of the gate trench 520, a gate dielectric layer 522 disposed at an inner sidewall of the gate trench 520 and the gate dielectric layer 522 is sandwiched between the gate electrode 524 and the substrate 10, a charge trapping dielectric layer 526 disposed adjacent to the gate electrode 524. Preferably, the charge trapping dielectric layer 526 is disposed conformably along the gate dielectric layer 522 and charge trapping dielectric layer 526 is also positioned on or above a top surface of the gate electrode 524.

The charge trapping dielectric layers 526 can be a single material layer or a composite material layer. The composite material layer consists of numerous different material layers. If the charge trapping dielectric layer 526 is a single material layer, the charge trapping dielectric layer 526 may be formed by a charge trapping dielectric such as $HfO_2$, $TiO_2$, $ZrO_2$, a germanium nanocrystal layer, an organic charge trapping material, $HfSiO_xN_y$, $MoSiO_qN_z$, or a combination thereof, wherein x, y, q and z are integers. The organic charge trapping material may be Poly(alpha methylstyrene). Furthermore, if the charge trapping dielectric 526 is a composite material layer, the charge trapping dielectric 526 may be formed by the combination of at least one charge trapping dielectric and at least one traditional dielectric. The traditional dielectric can be $SiO_2$, $Si_3N_4$ or other dielectrics.

Figure 6:
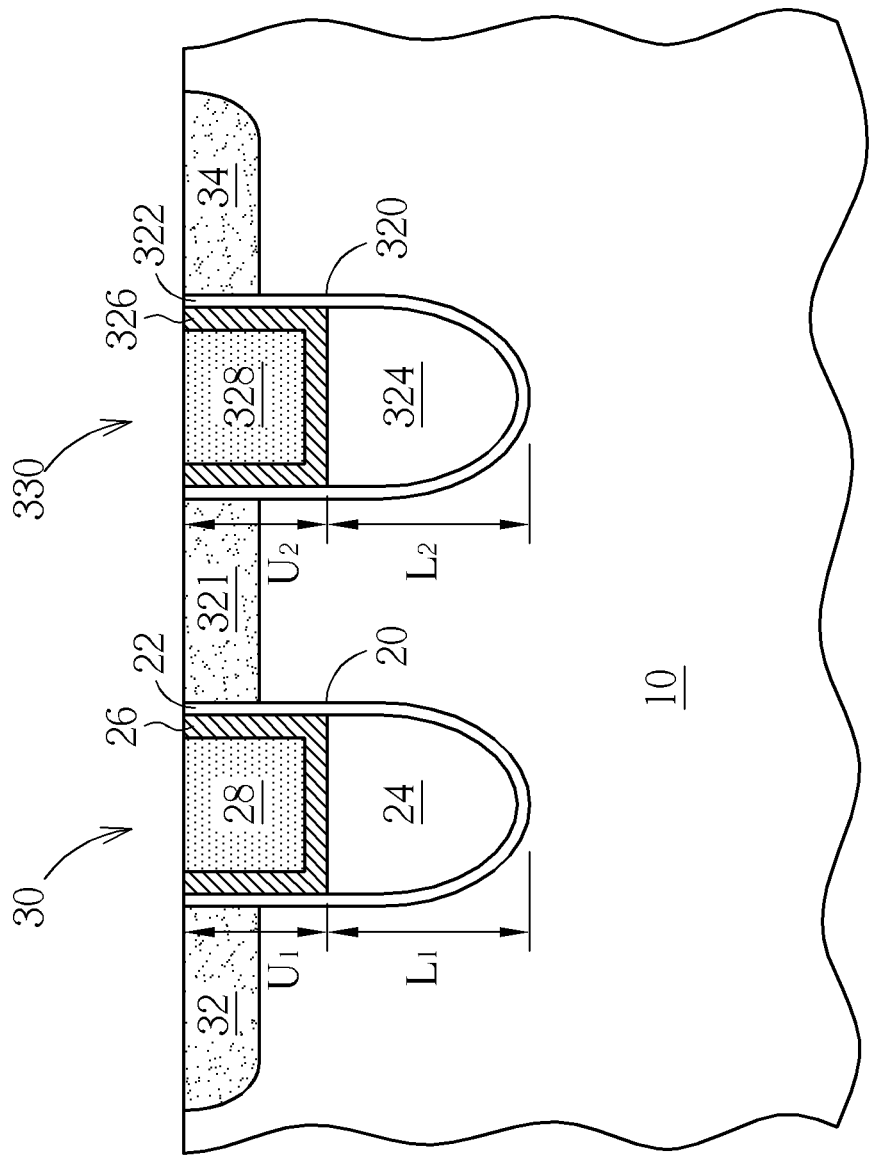
FIG. 6 shows another varied type of a semiconductor device capable of reducing influences of adjacent word lines.

In another embodiment, as shown in FIG. 6, the word lines 30, 330 in FIG. 4 can share a common source 321, and the STI 18 is not disposed between the word lines 30, 330.

Figure 7:
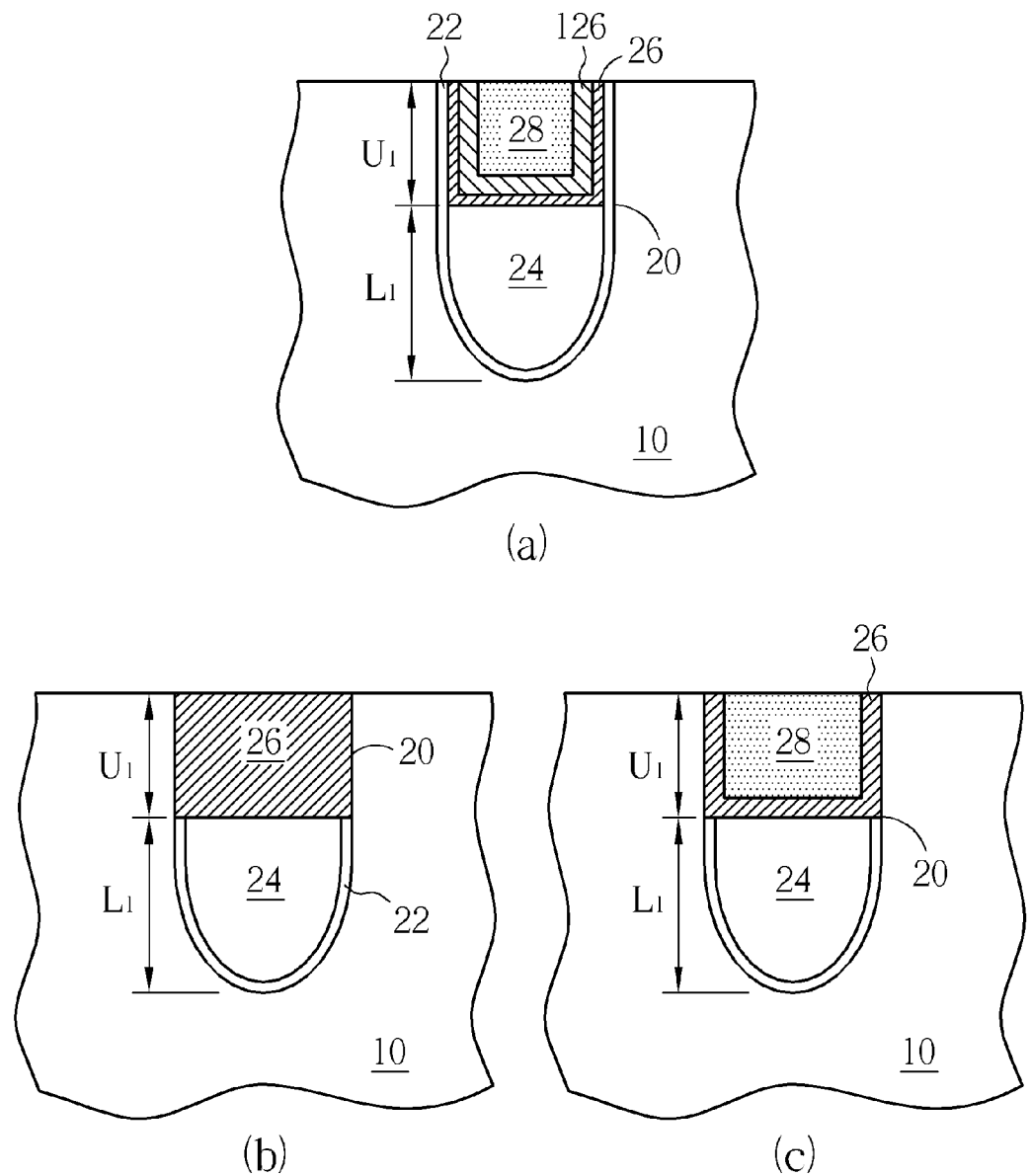
FIG. 7 shows several varied types of a word line which can be used in the semiconductor device capable of reducing influences of adjacent word lines.

FIG. 7 shows several varied types of a word line which can be used in the semiconductor device capable of reducing influences of adjacent word lines, wherein like numbered numerals designate similar or the same parts, regions or elements.

Because the word lines 30, 330, basically have the same structure, the following description is only demonstrated by the word line 30. Based on different product designs, there can be a single layer of the charge trapping dielectric layer, or a multiple layers of the charge trapping dielectric layers disposed in the upper part $U_1$ of the gate trench. For example, as shown in FIG. 7(a), another charge trapping dielectric layer 126 is disposed between the capping layer 28 and the charge trapping dielectric layer 26. The two charge trapping dielectric layers 26, 126 can be made of different materials, for example, the charge trapping dielectric layer 26 can be made of $HfO_2$, and the charge trapping dielectric layer 126 can be made of $ZrO_2$.

According to the varied type shown in FIG. 7(b), the gate dielectric layer 22 can only be positioned at the lower part $L_1$ of the gate trench 20, and the capping layer 28 described in FIG. 4 can be removed entirely. In other words, there is only the charge trapping dielectric layer 26 disposed at the upper part $U_1$ of the gate trench 22.

Based on a varied type shown in FIG. 7(c), the gate dielectric layer 22 can only be positioned at the lower part $L_1$ of the gate trench 20. Furthermore, the charge trapping dielectric layer 26 can be located on the sidewall of the upper part $U_1$ of the gate trench 20, and on the top surface of the gate electrode 24. The capping layer 28 can be positioned at the upper part $U_1$ of the gate trench 20. The two sidewalls and the bottom of the capping layer 28 can be surrounded by the charge trapping dielectric layer 26.

Figure 8:
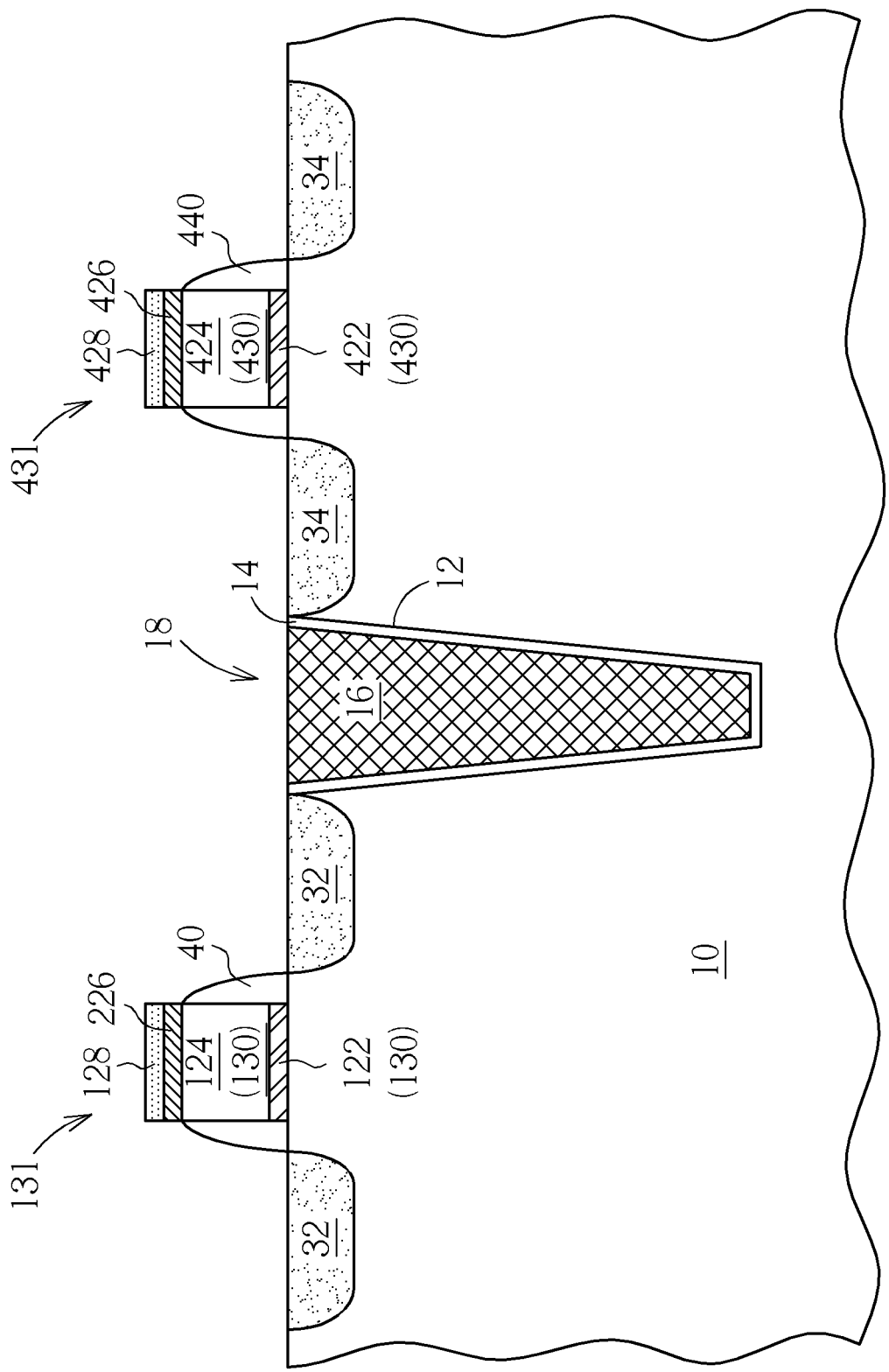
FIG. 8 depicts schematically a semiconductor device capable of reducing influences of adjacent transistors according to a third preferred embodiment of the present invention.

FIG. 8 depicts schematically a semiconductor device capable of reducing influences of adjacent transistors according to a third preferred embodiment of the present invention, wherein like numbered numerals designate similar or the same parts, regions or elements.

Please refer to both FIG. 4 and FIG. 8, the concept of word lines 30, 330 in FIG. 4 can be applied to two adjacent planar transistors 131, 431 shown in FIG. 8. As shown in FIG. 8, a semiconductor device capable of reducing influences of adjacent transistors 136 may include two planar transistors 131, 431. The gate structure 130 includes a gate electrode 124 positioned on the substrate 10, a gate dielectric layer 122 positioned between the gate electrode 124 and the substrate 10. A charge trapping dielectric layer 226 is disposed on or above a top surface of the gate electrode 124. A capping layer 128 covers the charge trapping dielectric layer 226. The gate structure 430 includes a gate electrode 424 positioned on the substrate 10, a gate dielectric layer 422 positioned between the gate electrode 424 and the substrate 10. A charge trapping dielectric layer 426 is disposed on or above a top surface of the gate electrode 424. A capping layer 428 covers the charge trapping dielectric layer 426.

The charge trapping dielectric layer 226 or the charge trapping dielectric layer 426 can be a single layer of charge trapping dielectric including $HfO_2$, $TiO_2$ or $ZrO_2$, a germanium nanocrystal layer, an organic charge trapping material, $HfSiO_xN_y$, $MoSiO_qN_z$, or a combination thereof, wherein x, y, q and z are integers. The organic charge trapping material may be Poly(alpha methylstyrene). The charge trapping dielectric layer 226 or the charge trapping dielectric layer 426 can be a composite material layer including at least one aforementioned charge trapping dielectric and at least one tradition dielectrics such as a $SiO_2$ film, a $Si_3N_4$ film or other dielectrics.

The capping layers 128, 428 can be $SiO_2$ or $Si_3N_4$. Moreover, two pairs of spacers 40, 440 can be disposed at two sides of the gate electrode 124, 424, respectively. Two source/drain doping regions 32, 34 are disposed in the substrate at two sides of the planar gate structure 130, 430. Therefore, the planar gate structure 130 and the source/drain doping region 32 forms a planar transistor 131; and the planar gate structure 430 and the source/drain doping region 34 forms a planar transistor 431. A STI 18 can be optionally disposed in the substrate 10 between the planar transistors 131, 431. The structure of the STI 18 is already described in the description for FIG. 4. Please refer to the description of FIG. 4 for detail.

It is noteworthy that even there is the STI 18 disposed in the middle of the planar transistors 131, 431, the planar transistors 131, 431 are still defined as two adjacent planar transistors.

Figure 9:
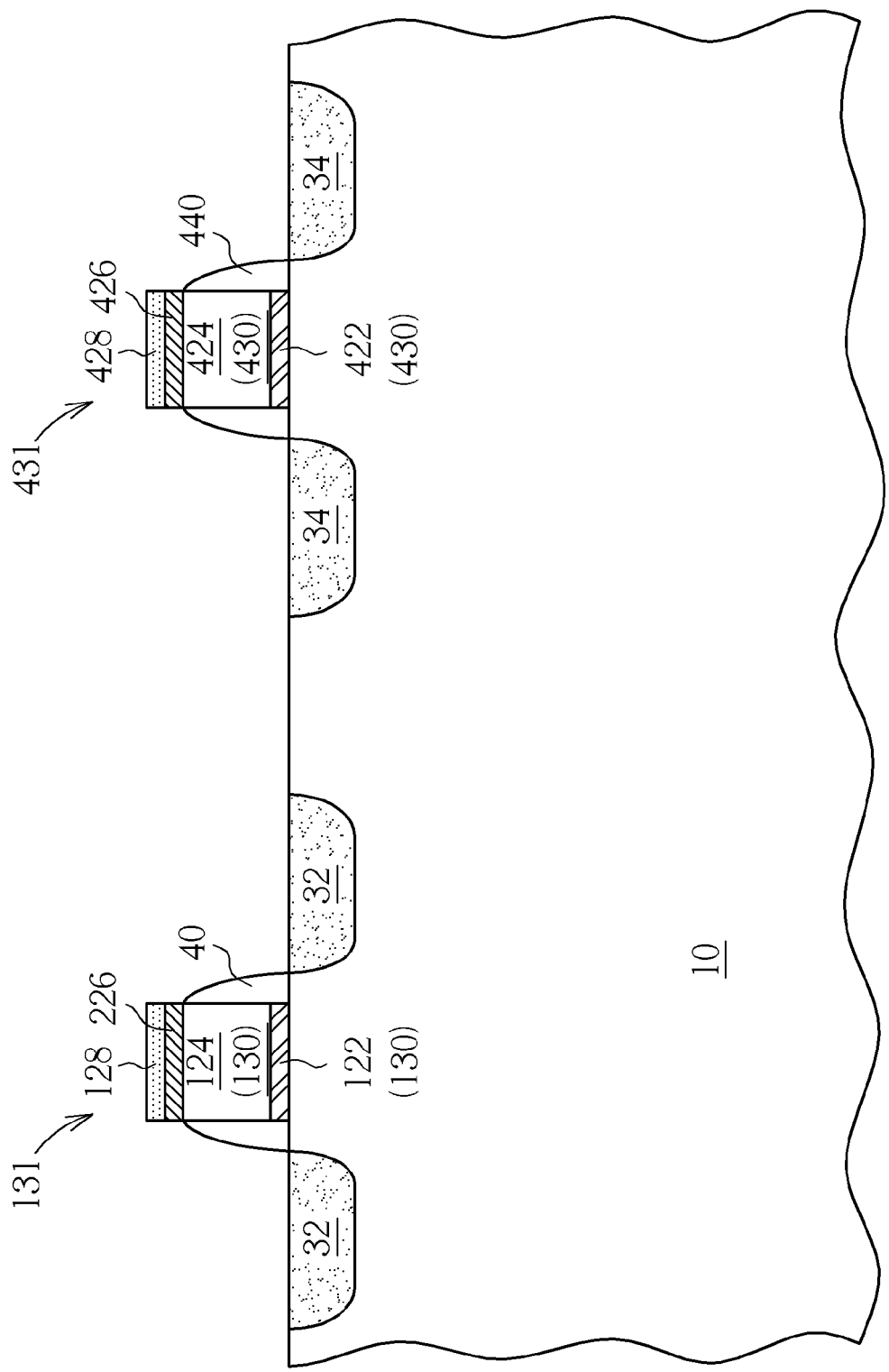
FIG. 9 depicts schematically a varied type of a semiconductor device capable of reducing influences of adjacent transistors according to a fourth preferred embodiment of the present invention.

FIG. 9 depicts schematically a varied type of a semiconductor device capable of reducing influences of adjacent transistors according to a fourth preferred embodiment of the present invention, wherein like numbered numerals designate similar or the same parts, regions or elements. As shown in FIG. 9, the planar transistors 131, 431 are disposed in the substrate 10, and there is no STI positioned between them.

Figure 10:
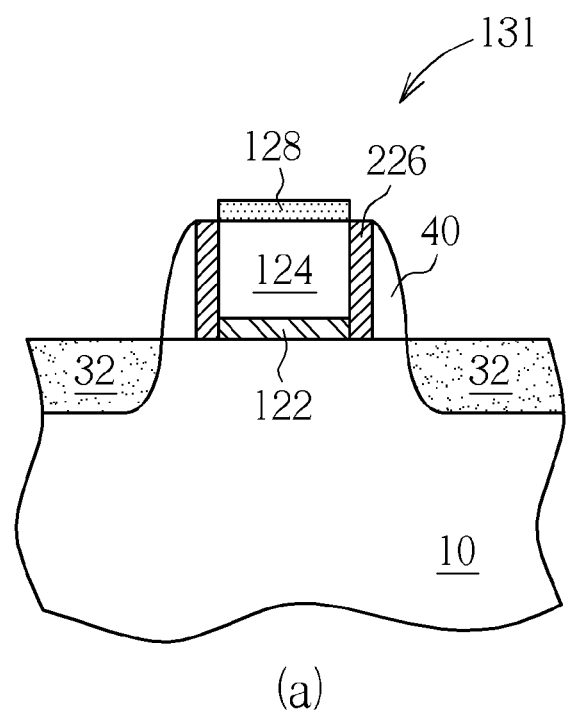
FIG. 10 shows several varied types of a transistor which can be used in the semiconductor device capable of reducing influences of adjacent transistors.
Figure 10:
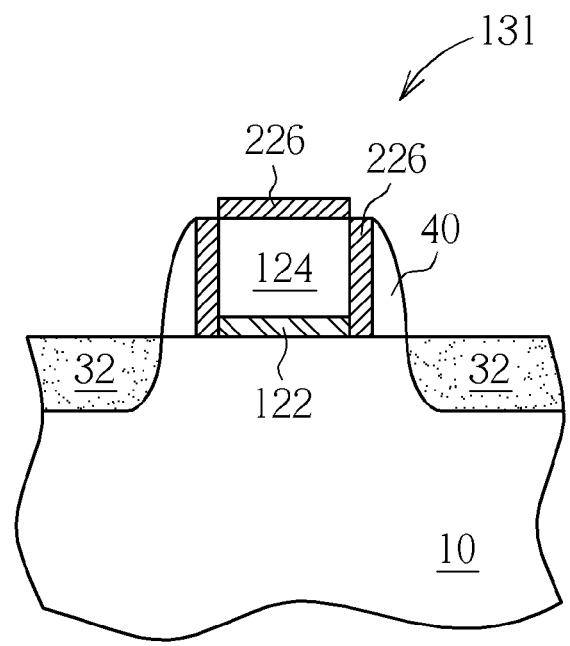

FIG. 10 shows several varied types of a planar transistor which can be used in the semiconductor device capable of reducing influences of adjacent transistors, wherein like numbered numerals designate similar or the same parts, regions or elements. Because the planar transistor 131, 431 basically have the same structure, the following description is only demonstrated by the planar transistor 131.

As show in FIG. 10(a), the charge trapping dielectric layer 226 can be disposed at two sidewalls of the gate electrode 124 rather than at the top of the gate electrode 124. The spacers 40 can cover the charge trapping dielectric layer 226.

As shown in FIG. 10(b), the capping layer 128 in FIG. 10(a) can be replaced by the charge trapping dielectric layer 226.

Figure 11:
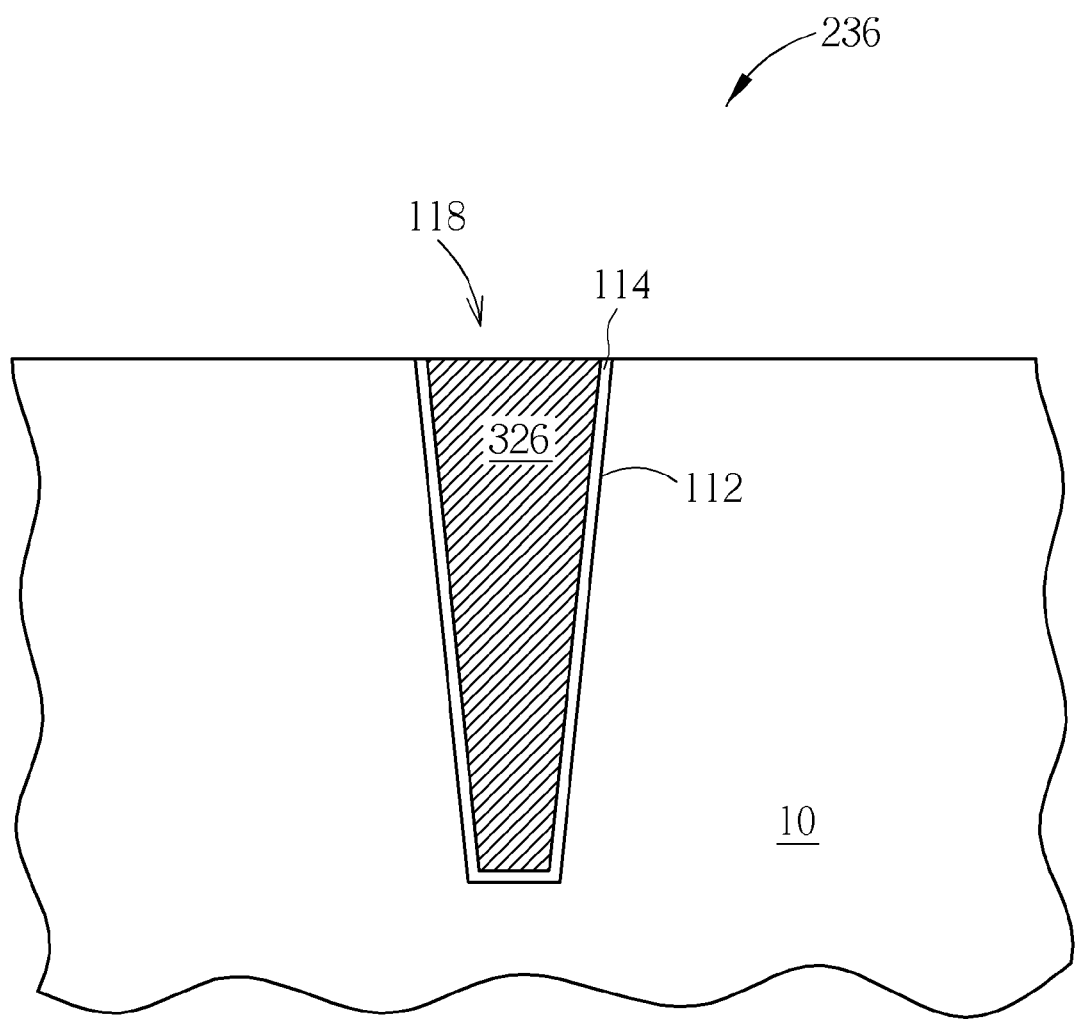
FIG. 11 depicts schematically a semiconductor device capable of reducing influences of adjacent elements according to a fifth preferred embodiment of the present invention.

FIG. 11 depicts schematically a semiconductor device capable of reducing influences of adjacent elements according to a fifth preferred embodiment of the present invention, wherein like numbered numerals designate similar or the same parts, regions or elements.

As shown in FIG. 11, a semiconductor device capable of reducing influences of adjacent elements 236 includes a STI 118 disposed within a substrate 10. The STI 118 is composed of a shallow trench 112, a liner layer 114, and at least one isolation layer 326 filling the shallow trench 112. The liner layer 114 is disposed along an inner sidewall of the shallow trench 112 and a bottom of the shallow trench 112. The isolation layer 326 can be a single material layer or a composite material layer. The composite material layer consists of numerous different material layers. Furthermore, if the aforementioned isolation layer 326 is a single material layer, the isolation layer 326 may be formed by a charge trapping dielectric such as $HfO_2$, $TiO_2$, $ZrO_2$, a germanium nanocrystal layer, an organic charge trapping material, $HfSiO_xN_y$, $MoSiO_qN_z$ or a combination thereof, wherein x, y, q and z are integers. The organic charge trapping material may be Poly (alpha methylstyrene).

Furthermore, if the isolation layer 326 is a composite layer, the isolation layer 326 may be formed by the combination of at least one charge trapping dielectric and at least one traditional dielectric. The traditional dielectric can be $SiO_2$ or $Si_3N_4$.

The charge trapping dielectric layer traps charges. The charges trapped on the charge trapping dielectric layer can be positive charges or negative charges. According to a preferred embodiment of the present invention, the charges trapped on the charge trapping dielectric layer are positive charges. When applying voltage to a gate structure, the charge trapping dielectric layer can offer charges to form a channel under the gate structure. Therefore, function of a word line or a transistor can be kept stable when an adjacent word line or an adjacent transistor turns on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device capable of reducing influences of adjacent transistors comprising:
   a substrate;
   a first transistor disposed on the substrate, wherein the first transistor comprising:
   a first gate electrode disposed on the substrate;
   a first gate dielectric layer disposed between the first gate electrode and the substrate; and
   at least one first charge trapping dielectric layer disposed directly above the first gate electrode, wherein no gate electrode is stacked on the first charge trapping dielectric layer.

2. The semiconductor device capable of reducing influences of adjacent transistors of claim 1, wherein the first charge trapping dielectric layer comprises HfO2, TiO2, ZrO2, a germanium nanocrystal layer, an organic charge trapping material, HfSiOxNy, or MoSiOqNz, wherein x, y, q and z are integers.

3. The semiconductor device capable of reducing influences of adjacent transistors of claim 1, wherein the first transistor is a planar transistor.

4. The semiconductor device capable of reducing influences of adjacent transistors of claim 1, wherein the first charge trapping dielectric layer is disposed on a top surface of the first gate electrode.

5. The semiconductor device capable of reducing influences of adjacent transistors of claim 1, further comprising a capping layer disposed on the first charge trapping dielectric layer, wherein the capping layer comprises Si3N4 or SiO2.

6. The semiconductor device capable of reducing influences of adjacent transistors of claim 1, wherein the first charge trapping dielectric layer is disposed at a sidewall of the first gate electrode.

7. The semiconductor device capable of reducing influences of adjacent transistors of claim 1, further comprising a shallow trench isolation (STI) embedded in the substrate, wherein the STI is adjacent to the first transistor.

8. The semiconductor device capable of reducing influences of adjacent transistors of claim 7, wherein the STI comprises a shallow trench disposed in the substrate, a second charge trapping dielectric layer fills in the shallow trench, and the second charge trapping dielectric comprises HfO2, TiO2 or ZrO2, a germanium nanocrystal layer, an organic charge trapping material, HfSiOxNy, or MoSiOqNz, wherein x, y, q and z are integers.

9. The semiconductor device capable of reducing influences of adjacent transistor of claim 1, further comprising a source/drain doping region disposed in the substrate at one side of the first transistor.

10. The semiconductor device capable of reducing influences of adjacent transistors of claim 1, further comprising
a second transistor disposed on the substrate, wherein the second transistor comprising:
a second gate electrode disposed on the substrate;
a second gate dielectric layer disposed between the second gate electrode and the substrate; and
at least one third charge trapping dielectric layer disposed adjacent to the second gate electrode.

11. The semiconductor device capable of reducing influences of adjacent transistors of claim 10, wherein the third charge trapping dielectric layer comprises HfO2, TiO2, ZrO2, a germanium nanocrystal layer, an organic charge trapping material, HfSiOxNy, or MoSiOqNz, wherein x, y, q and z are integers.

* * * * *